US007406021B2

(12) United States Patent
Magnitski et al.

(10) Patent No.: US 7,406,021 B2
(45) Date of Patent: Jul. 29, 2008

(54) ELECTROLUMINESCENT MULTILAYER OPTICAL INFORMATION STORAGE MEDIUM WITH INTEGRATED READOUT AND COMPOSITION OF MATTER FOR USE THEREIN

(75) Inventors: Serguei Magnitski, Moscow (RU); Andrei Tarasishin, Moscow (RU); Eugene Levich, New York, NY (US); Jacob Malkin, Ashdod (IL); Tatiana Lissovskaya, Moscow (RU); Iossif Diskin, Moscow (RU); Zeev Orbach, Ashqelou (IL); Boris Chernobrod, Ashdod (IL)

(73) Assignee: D Data Inc., New York, NY (US)

( * ) Notice: Subject to any disclaimer, the term of this patent is extended or adjusted under 35 U.S.C. 154(b) by 585 days.

(21) Appl. No.: 10/986,879

(22) Filed: Nov. 15, 2004

(65) Prior Publication Data

US 2005/0265209 A1 Dec. 1, 2005

Related U.S. Application Data

(62) Division of application No. 09/502,769, filed on Feb. 11, 2000, now Pat. No. 6,819,649.

(60) Provisional application No. 60/119,902, filed on Feb. 12, 1999.

(51) Int. Cl.
*G11B 9/00* (2006.01)
(52) U.S. Cl. .......................... 369/126; 250/306; 345/79; 313/506
(58) Field of Classification Search ................ 369/126, 369/112.01, 275.1, 283, 272.1; 250/306; 313/506; 365/151, 118, 106, 153
See application file for complete search history.

(56) References Cited

U.S. PATENT DOCUMENTS

| 5,416,494 | A | 5/1995 | Yokota et al. |
| 5,568,417 | A | 10/1996 | Furuki et al. |
| 5,623,476 | A | 4/1997 | Eguchi et al. |
| 5,703,436 | A | 12/1997 | Forreste et al. |
| 5,792,561 | A | 8/1998 | Whang et al. |
| 5,812,516 | A | 9/1998 | Nose et al. |
| 7,116,628 | B2 * | 10/2006 | Magnitski et al. ........... 369/126 |

FOREIGN PATENT DOCUMENTS

| GB | 1 298 462 | 12/1972 |
| WO | WO 96/37888 | 11/1996 |

OTHER PUBLICATIONS

"AS-MO (Advanced Storage-Magneto Optical Disk) Version 1.0, Part 1—Physical Specifications—" (Fujitsu Liited, Hitachi, Ltd., Hitachi Maxell, Ltd., Imation Corp. Olympus Optical Co., Ltd., Philips Electronics N.V., Sanyo Electric Co., Ltd., Sharp Corporation, Sony Corporation, pp. cover, I-vii, 53-64, Apr. 1998.).

\* cited by examiner

*Primary Examiner*—Ali Neyzari
(74) *Attorney, Agent, or Firm*—Winston & Strawn LLP

(57) ABSTRACT

An optical information storage medium has multiple information layers. On each layer, information is stored in the form of an electroluminescent material. The pits are organized into regions called pages. A specific page on a specific layer can be addressed through electrodes integrated into the medium. The medium can be read-only or WORM. For the WORM embodiment, a recordable electroluminescent material is combined with a quencher and a free radical generating compound that, when thermally degraded, generates free radicals to bleach the quencher. To amplify the light from an information layer, a photoconductive layer and an additional electroluminescent layer can be provided.

2 Claims, 3 Drawing Sheets

ELECTROLUMINESCENT MULTILAYER OPTICAL INFORMATION STORAGE MEDIUM WITH INTEGRATED READOUT AND COMPOSITION OF MATTER FOR USE THEREIN

REFERENCE TO RELATED APPLICATION

This. application is a divisional of U.S. patent application Ser. No. 09/502,769, filed Feb. 11, 2000, U.S. Pat. No. 6,819,649 which claims the benefit of U.S. Provisional Application No. 60/119,902, filed February 12, 1999, whose disclosure is hereby incorporated by reference in its entirety into the present disclosure.

BACKGROUND OF THE INVENTION

1. Field of the Invention

This invention relates to an optical memory such as optical card or an optical disk. In particular, this invention relates to an electroluminescent device that in one embodiment has an organic or inorganic electroluminescent material capable of being driven by either a positive or negative electric field, so that the device is capable of being used with either a forward or a reverse electrical current. Most particularly, the invention relates to optical ROM and WORM devices based on an electroluminescent material device capable of being driven by an alternating electric field. A material for a WORM medium is also disclosed.

2. Description of Related Art

Existing optical memory systems use two-dimensional data carriers with one or two information layers. Most of the previous technical solutions to optical data recording propose registering changes in reflected laser radiation intensity in local regions (pits) of an information layer. Such changes can be a consequence of interference effects in relief optical discs of the CD-ROM type, burning of holes in the metal film, dye bleaching, local melting of polycarbonate in widely-used CD-R systems, change of reflection coefficient in phase-change systems, etc.

Three-dimensional, i.e., multilayer, optical storage systems provide comparatively higher storage capacity. However, they impose specific limitations and requirements on the construction and features of recording media, the techniques for data recording and reading, and especially the depth of the recording media.

Existing optical media, such as CD-ROM and DVD-ROM disks, are normally read in reflection mode. However, for a multilayer storage medium to be read in reflection mode, every information layer must have an at least partially reflective coating. As a consequence, when a layer close to the bottom of the medium is read, both the reading beam and the reflected beam pass through many such coatings, thereby attenuating the reflected beam to an unacceptable extent. Also, because existing optical media are read with coherent radiation, both beams are subject to diffraction and interference distortions on pits and grooves of the information layers.

That is why multilayer fluorescent discs with fluorescent reading are preferable, as they are free of partly reflective coatings. Diffraction and interference distortions are also reduced because of the incoherent nature of fluorescent radiation, its longer wavelength in comparison to the reading laser wavelength, and the transparency and homogeneity (similar reflection coefficients of different layers) of the optical media upon the incident laser and the fluorescent radiations. Thus, multilayer fluorescent discs have some advantages in comparison to reflective discs.

Optical memory cards are ROM or WORM media having a credit card form. The cards are highly durable, easily carried in a user's pocket, and unaffected by electrostatic and magnetic fields or heat. Optical memory cards surpass all other card technologies in terms of data capacity.

Information retrieval in fluorescent optical memory systems, in particular, fluorescent ROM and WORM optical memory cards, is realized with the help of external light sources. Reading light is absorbed in a fluorescent material held in information pits and excites the fluorescence of the material.

In an unrelated field of endeavor, inorganic electroluminescence devices were discovered by Destriau in 1936. Destriau observed that when suitably prepared inorganic zinc sulfide phosphor powders activated with small additions of copper were suspended in an insulator and an intense alternating electric field (15 kV) was applied with capacitor-like electrodes, light emission resulted.

Electroluminescent research gained further impetus with the advent of transparent conducting electrodes based on tin oxide ($SnO_2$) in the late 1940's. Typically, early devices were composed of two sheets of electrically conductive material serving as electrodes, one a thin conducting backing and the other a transparent conductive film, placed on opposite sides of a plastic or ceramic sheet impregnated with the inorganic phosphor, such as zinc sulfide doped with small amounts of copper or magnesium. A transparent glass sheet placed next to the transparent conductive sheet served as an outermost protective substrate. Application of an alternating voltage to the electrodes caused an electric field to be applied to the phosphor. Each time the field would change, radiation having a wavelength in the visible range was emitted.

Although a large amount of research and investigation was conducted on the alternating current electroluminescent devices, the devices never achieved practice application although they were originally highly touted as a room lighting sources. Unfortunately, at high brightness levels the AC electroluminescent devices exhibited a very short life, and after about 1963, most of the research into the AC electro-luminescence devices was severely curtailed.

The most recent efforts in this area have been directed to a molecular carbon (e.g., a form of carbon known as fullerene-60) system. The high voltage drive requirements, the associated high cost of drive circuitry, poor stability and lack of color capability have made these devices cost prohibitive.

Two other inorganic devices, 1) direct current (DC) inorganic semiconductor light emitting diodes (LEDs) and 2) fluorescent ion doped inorganic semiconductor thin film devices, trace their origins to the mid-fifties. Light emitting diodes based on forward biased inorganic semiconductor p-n junctions are limited to small area applications as a result of color, efficiency and cost limitations. The other inorganic devices, fluorescent ion-doped inorganic semiconductor thin film devices, require high operating voltages to accelerate electrons or holes to sufficient energies in order to excite or ionize the fluorescent ion centers. Such high operating voltages result in thin-film instability and failure of such devices.

Electroluminescent organic materials include both molecular and polymer forms These materials include light emitting polymeric polypyridines such a poly(p-pyridines), co-polymers such as poly(phenylenevinylene pyridylvinylene) and molecular light emitters such as 8-hyrooxyquinoline. Insulating materials include a wide variety of ceramics such as aluminum oxide and inorganic and organic materials such as polysilane, polymethylmethacyline, nylon, cimeraldine base (an insulating polyaniline polymer) and organic molecules such as 2-(4-biphenyl)-5-(4-tert-butylphenyl)-1, 3,4 oxdiazole. Electrodes can be fashioned from any suitable conductor including, but not limited to, a wide variety of conducting materials including 1) indium tin oxide, 2) metals such as gold, aluminum, calcium, silver, copper, and indium, 3) alloys such as magnesium-silver, 4) conducting fibers such as carbon fibers, and 5) conducting organic polymers such as conducting doped polyaniline and conducting doped polymole.

In typical applications where the device is used for lighting and display, at least one of the electrodes is fashioned from a transparent material such as indium tin oxide or a partially transparent material such as conducting doped polyaniline. The insulator between the light emitting material and the transparent or partially transparent electrode is also transparent or partially transparent and fabricated from an optically clear insulating polymer such as polymethylmethacrylate or a partially transparent insulating polymer such as the insulating emeraldine base form of polyaniline. Partially transparent electrodes and insulators can be used to advantage to filter or clip unwanted portions (frequencies) of light emitted from the organic light emitter.

For ease of manufacture and insulation purposes, it is preferable to form the device on a substrate which also serves to protect and typically insulate the device during use. Glass and clear insulating plastic are preferable when the device is used for lighting and display purposes. The AC driven symmetrical device is especially suitable for light emissions from both sides of the device in which case both insulators and electrodes are at least partially transparent as well as any insulating substrates that may be used with one or both electrodes.

In the last decade, there has been an emerging interest in direct current (DC) molecular and polymer electroluminescence devices. A variety of organic molecules and conjugated polymers, copolymers and mixtures have been found to exhibit electroluminescent properties. Light-emitting diodes incorporating these materials have demonstrated all of the necessary colors (red, green, and blue) needed for display applications. However, a need continues to exist to lower the device operating voltages and to increase their light-emitting (output) efficiency. Further improvements in charge injection and the balancing of charge transport are needed. Because of the asymmetry of the device configuration, efficient charge injection occurs only in one direction (forward DC bias). Under reverse bias, most of the devices either degrade quickly or show very poor performance. Although efforts have been made to improve the charge injection efficiency by the use of low work function electrodes such as calcium or magnesium and the use of an electron transporting material to improve negative charge (electron) injection, such devices continue to be operational in only one direction. Similarly, efforts have been made to improve charge injection efficiency by the use of high work function electrodes such as indium tin oxide (ITO) or gold and the use of hole transporting materials to improve positive charge (hole) injection. Such devices also continue to be operational in only one direction.

SUMMARY OF THE INVENTION

A need continues to exist to develop bipolar devices that have low turn on and operating voltages, flexibility, large area, high operating (light output) efficiency and low production cost. It is therefore a primary object of the invention to provide such devices.

It is another object of the present invention to store information in fluorescent multilayer cards, tapes and any other optical media which have no moving parts (such as ROM cards and WORM cards).

It is still another object of the present invention to provide a 3-D optical memory device for recording and reading information.

It is yet another object of the present invention to provide a 3-D optical WORM (write once, read many) memory device for information in which writing is implemented by photochemical decomposition of a quencher of electroluminescence and reading is implemented by registration of electroluminescence, as well as to provide a composition of matter for use in such a WORM drive.

To achieve the above and other objects, the present invention is directed to a multilayered optical memory card whose information pits are filled with electroluminescent materials. Information readout is realized by applying voltage to a desired information page which causes fluorescence irradiation. Such an optical card allows the use of integrated electronics.

Data on each layer are organized into a plurality of regions or patches (called pages). A data page is selectively illuminated and imaged onto an array of light sensors, e.g., by an array of lenslets. Transmitted page data, in this case light passed through the transparent bit locations on the data layer, strike different ones of the light sensors, thereby outputting a pattern of binary bits in the form of electrical data signals.

The data storage and retrieval system of the present invention is embodied in ROM devices and WORM devices as described more fully below in the detailed description. A preferred embodiment of the invention involves forming the data layer as a bonded structural unit or card, much like a sandwich of different layers of material, to thereby fix the optical distances and registrations of these elements. This bonded data card structure minimizes the adverse optical effects of differential thermal expansion between the data layers and allows for an exceedingly dense data pattern.

There is a great need in optical devices which will have not moving parts. The main advantage of the this design is the increased reading speed. Another advantage is improved reliability of the drive for reading the optical medium.

The present invention offers the following advantages:

Absence of interlayer and interpage crosstalk (as electroluminescence is excited only in the certain page);

Ultrahigh data density (1 bit/mcm$^3$ or 100 Gbytes/cm$^3$);

Possibility of color electroluminescent card that means higher information capacity; and High information bit rate (more than 1 Gbit/sec).

BRIEF DESCRIPTION OF THE DRAWINGS

Preferred embodiments of the present invention will be set forth in detail with reference to the drawings, in which.

DETAILED DESCRIPTION OF THE PREFERRED EMBODIMENTS

Figure 1:
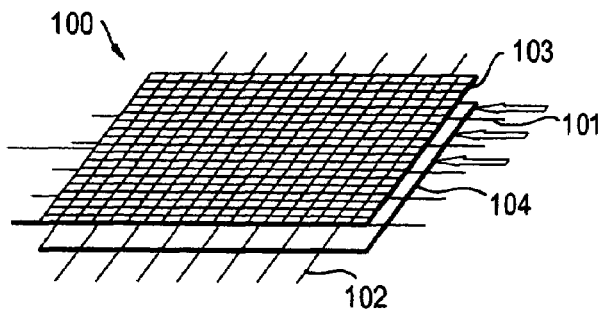
FIG. 1 shows a plan view of the layers of an optical card according to the first and second embodiments of the invention.

Preferred embodiments will now be set forth in detail with reference to the drawings, in which like reference numerals refer to like components throughout.

FIG. 1 generally shows a first embodiment for an optical ROM or WORM device with electroluminescent reading of information. The device, shown as a card 100, includes an information layer 101 with thickness 0.5-40 microns made of a suitable plastic material, preferably polycarbonate, polychlorovinyl, or polymethylmethacrylate, which serves as a mechanical base for the card 100. Every information layer includes large numbers of data pits 104 lying in the same place. Every pit contains a layer of electroluminescent material, in this example poly(p-phenylene vinylene) on the bottom of the pit dissolved in a plastifier.

The electroluminescent material is a polymer selected from the group of electroluminescent polymers consisting of polypyridines, polypyridyvinylenes, polyphenylenes, polyphenylenevinylenes, polythiophenes, polyvinylcarbazoles, polyfluorenes, polynaphthalenevinylenes, polyphenyleneacetylenes, polyphenylenediacetylenes, polycyanoterephthalylidenes, polyphenylenebenzobisthiazoles, polybenzimidazobenzophenanthrolines, polypyridine copolymers, polypyridylvinylene copolymers, polyphenylene copolymers, polyphenylenevinylene copolymers, polythiophene copolymers, polyvinylcarbazole copolymers, polyfluorene copolymers, polynaphthalenevinylene copolymers, polyphenyleneacetylene copolymers, polyphenylenediacetylene copolymers, polycyanotherephthalylidene copolymers, polyphenylenebenzobisthiazole copolymers, polybenzimidazobenzophenanthroline copolymers, and mixtures thereof.

Voltage is applied using a wire netting of transparent electrodes. Each anode 102 is a thin layer of indium tin oxide (ITO), and each cathode 103 can be any conductor providing electron injection into the adjacent information layer 101. The voltage source can be a direct voltage source connected in either direction, that is, connected to produce a current that flows in either a forward or a reverse direction. Preferably the voltage source is an alternating voltage source producing an alternating current. A typical square surrounded by the wire netting is about 1mm$^2$. The pixellation and patterning of the emission is achieved through the distribution of the pits 104 and not through patterning of the electronics. The operation voltage is about 5V, and the current density is in the range of 1-500 mA/cm$^2$. Emission from the layer (electroluminescence) is detected by a CCD matrix via a lens. While one set of layers 101, 102, 103 is shown, it will be understood that multiple such sets of layers can be stacked on one another, in which case they can be separated by insulating layers. Also, a substrate and a top protective layer can be provided, as known in the art. The symmetrical arrangement of electrodes allows the use of alternating current.

The second embodiment for optical device for ROM or WORM with electroluminescent reading of information has the same basic arrangement of layers as shown in FIG. 1; therefore, the description thereof will not be repeated. Such a device includes an information layer with thickness 2-20 microns made of a sol-gel film which serves as a mechanical base for the medium. Every information layer has many data pits lying in the same plane. Every pit contains a inorganic phosphor, e.g., ZrS as an electroluminophore.

Voltage is applied using the wire netting of transparent electrodes. A wide variety of electrode materials can be used to the electrodes of the present device including 1) indium tin oxide, 2) metals, including calcium, aluminum, iodine, gold, copper, and silver, 3) alloys, such as magnesium silver, 4) conducting non-metals such as carbon and graphite fibers and filaments, and 5) conducting polymers such as polyamine doped with dopants such as camphor sulfonic acid, hydrochloric acid, tosylic acid, and docecylbenzene sulfonic acid and polypyrrhole doped with phosphorous hexafloride and p-toluenesulfonate. As used here a conducting polymer is a polymer with a conductivity of more than about 10$^{-2}$S/cm and preferably more than about 10$^{-1}$ S/cm.

For many applications, it is desirable to use a transparent electrode such as indium tin-oxide and a transparent insulator such as polymethylmethacrylate. It is often preferable to fabricate the device using a suitable substrate. Typically, the substrate is an insulating material such as a plastic or glass. Glass and optical plastics such a polymethylmethacrylates, polycarbonates, and polystyrene may be used when light transmission is desired. Inorganic materials permit the use of alternating voltage. A typical square surrounded with the wire netting is about 1 mm$^2$. The operation voltage is about 45V, and the frequency is 400 Hz. Emission from the information layer (electroluminescence) is detected by a CCD matrix via a lens. The modifications proposed above for the first embodiment can also be applied to the second embodiment.

Figure 2:
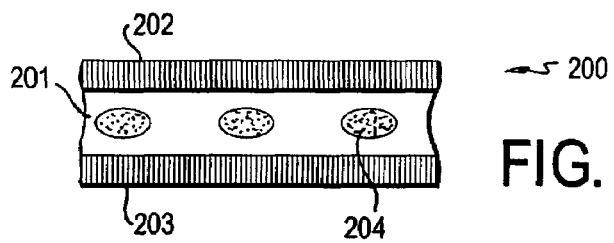
FIG. 2 shows a cross-sectional view of the layers of an optical card according to the third embodiment of the invention.
Figure 3:
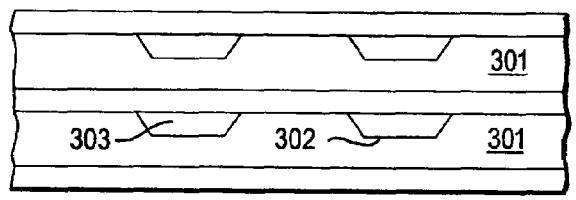
FIG. 3 shows a cross-sectional view of the layers of an optical card according to the fourth embodiment of the invention.

FIG. 2 shows a third embodiment for a ROM or WORM optical device with electroluminescent reading of information. The embodiment includes a multilayer structure 200 in which every data layer has an electroluminescent layer 201 functioning as an information layer and a pair of transparent electrodes 202 and 203 with the electroluminescent layer 201 therebetween.

The electroluminescent layer 201 is made of a suitable plastic material, preferably polycarbonate, polychlorvinyl, or polymethylmethacrylate, which serves as a mechanical base for the medium. Every electroluminescent layer 201 has many data pits 204 lying in the same plane. Every pit 204 contains a layer of electroluminescent material such as poly (p-phenylene vinylene) on the bottom of the pit dissolved in plastifier.

The anode 202 is a thin layer of transparent ITO, and the cathode 203 is made of Al. Each of the electrode layers 202 and 203 is an array of conductors with X and Y orientations, thereby allowing selective addressing of a portion of the electroluminescent layer 201. The same addressing technique can be used in the first and second embodiments. The operation voltage is about 5V, and the-current density is in the range of 1-500 mA/cm$^2$. Emission from the layer electroluminescence is directed onto a CCD matrix by a lens.

The fourth embodiment for a WORM optical device has a multilayer structure 300 in every information layer 301 has one or more spiral grooves 302 (or grooves of another shape, or arrays of pits) lying in the same plane. Every groove 302 contains a thin (10-100 nm) active layer 303 of a recording medium including an electroluminescent material, poly(p-phenylene vinylene), and a dye composition. Information recording in such a device is done by a focused laser beam which scans the surface of the active layer. The laser radiation is absorbed by a dye that transforms the energy of the laser into heat, causing physical and chemical changes in the active layer. The constituents of the active layer are:

1. Electroluminescent material—poly(p-phenylene vinylene).

2. Compound capable of generating free radicals when thermally degraded (azodiizobutyronitryle). These free radicals react with the quencher of the electroluminescent material and cause its bleaching.

3. Fluorescent quencher for electroluminescent material. This compound is selected from the group of dyes consisting of 3,3'-diethylexa dicarbocyanine iodide, 4-dicyanmethylene-2-methyl-6-(p-dimethylaminostyryl)-4-pyran, and 1,1'-diethyl-2,2'-carbocyanine iodide.

Other layers 304 can separate the information layers 301. Such other layers can include electrodes, insulators, or the like.

Information recording in the device is implemented by photobleaching the quencher enabling the increasing the initial fluorescent signal. In addition, the active layer composition can contain compounds which promote or suppress photothermic bleaching, plastics, and organic reducers which prevent free radicals deactivation by oxygen.

Figure 4:
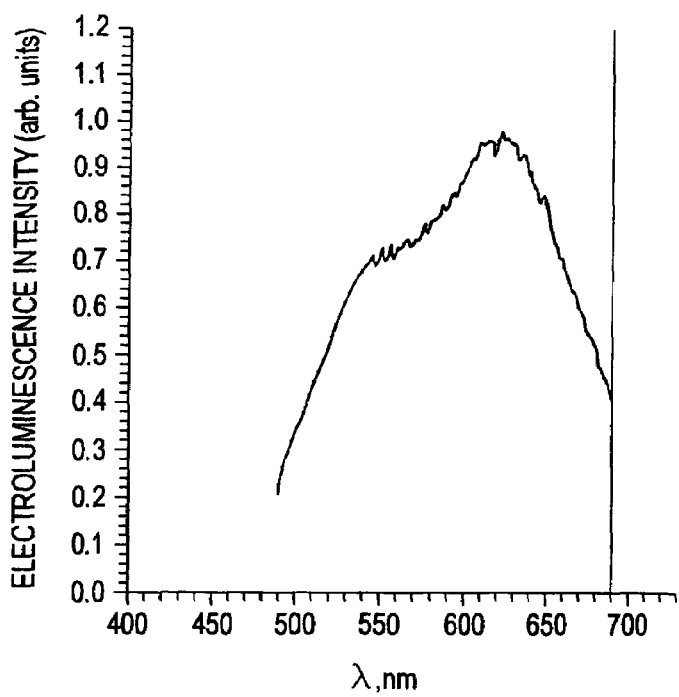
FIG. 4 shows the electroluminescent spectrum of poly(p-phenylene vinylene) showing wavelength in manometers on the horizontal axis and electroluminescent intensity in arbitrary units on the vertical axis.

The typical elecroluminescent spectrum of poly(p-phenylene vinylene) in vinyl acetate on a PMMA substrate in the presence of 0.004M of azodiizobutyronitryle and 0.035M of 3,3'-diethyloxadicarbocyanine iodide (absorber and quencher) is shown in FIG. 4 (wavelenth in nanometers on the horizontal axis and electroluminescence intensity in arbitrary units on the vertical axis). The spectrum was measured using an HR340 spectrograph.

Figure 5:
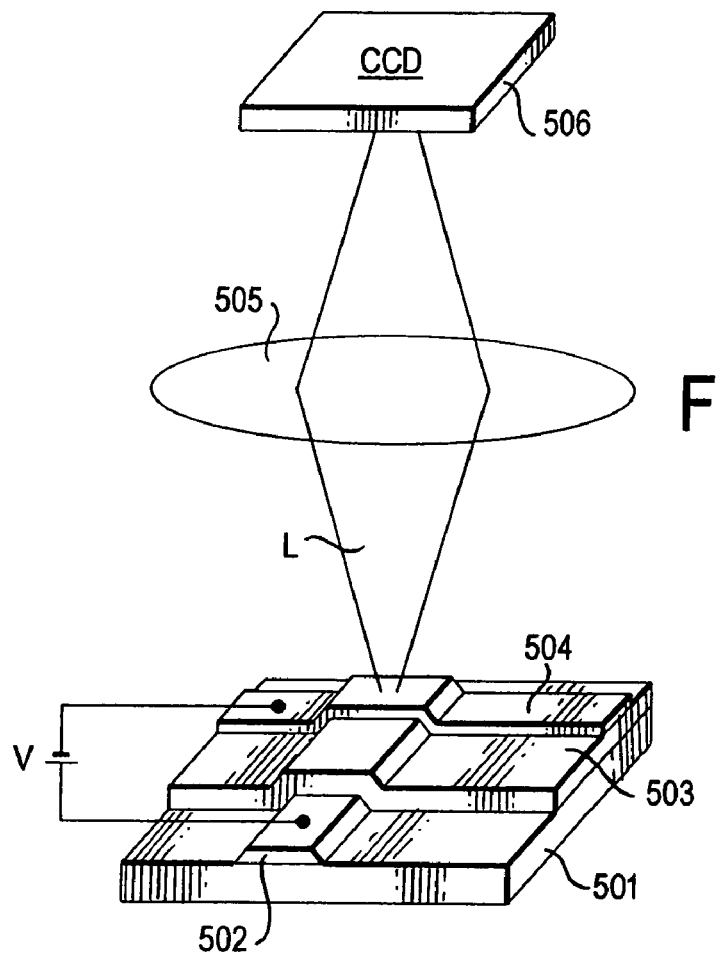
FIG. 5 shows a schematic of one page of information in any of the preceding embodiments and the manner in which it is addressed.

In FIG. 5, the schematic of one of information pages of a many-layered electroluminescing optical card according to any of the preceding embodiments is shown. A substrate 501 supports a transparent anode 502, a light emitting layer 503, and a cathode 504 in that order. The light emitting layer 503 can be separated from the anode 502 and the cathode 504 by a hole transport layer and an electron transport layer respectively; for the sake of clarity, neither of those layers is shown. A voltage V applied between the anode 502 and the cathode 504 causes the light emitting layer to emit light L, which is focused by an objective lens 505 onto a CCD array or other detector 506, so that information is reproduced. Any page of information on any layer can be addressed by applying the voltage V to the specific anode 502 and cathode 504 associated with that page.

Figure 6:
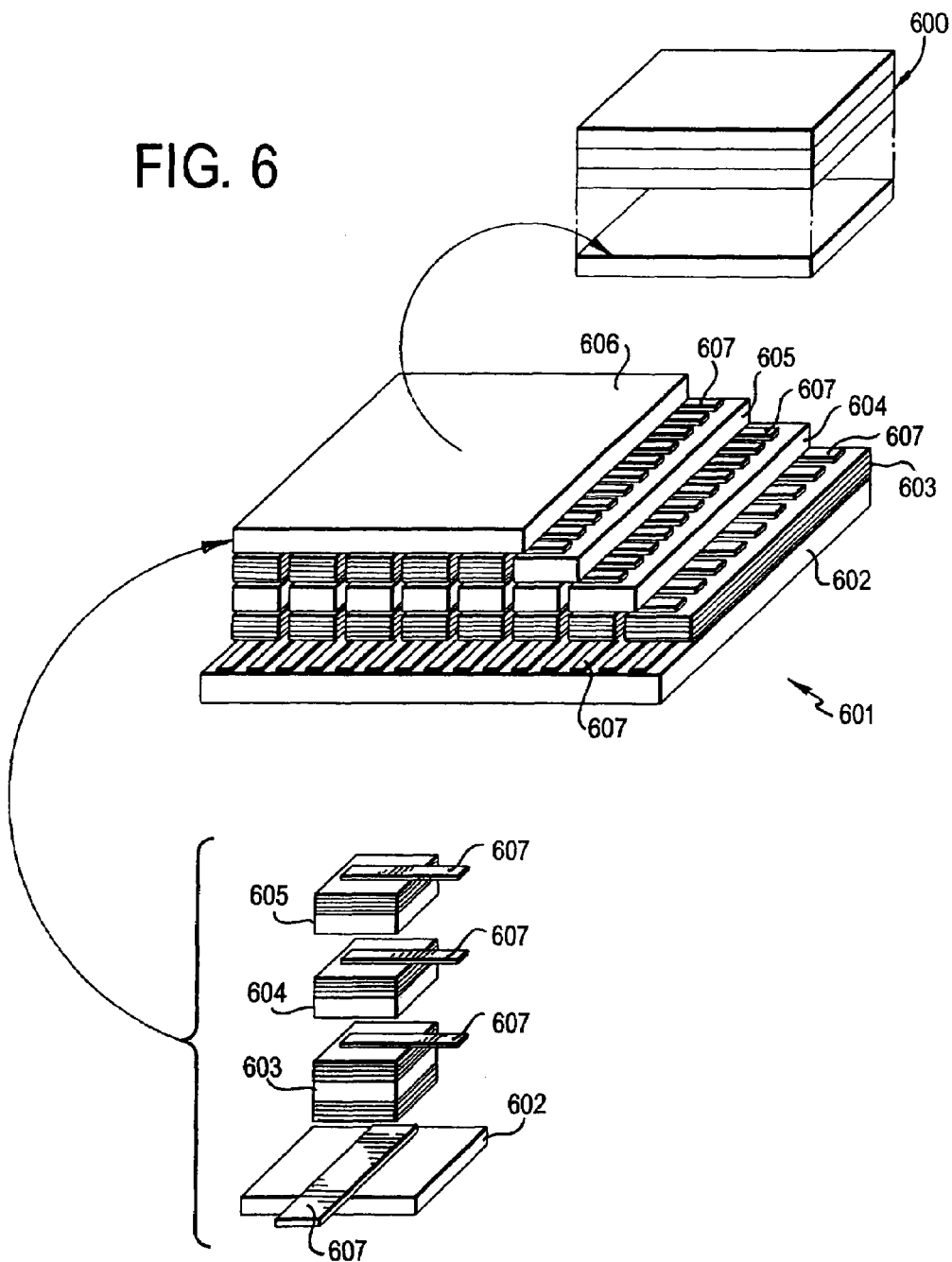
FIG. 6 shows a modification of FIG. 5 that increases information capacity by the use of multiple colors.

The information capacity of an electroluminescent 3D optical memory can be increased with the help of electroluminescing layers with different electroluminescence wavelengths. As shown in FIG. 6, a stack 600 of layers includes multiple layers 601, of which the lowest layer 601 rests on a substrate 602. The layer 601 includes layers 603, 604, and 605 that undergo electroluminescence at different wavelengths in response to addressing voltages applied through the appropriate electrodes 607. An intermediate layer 606 separates the layers 601 from one another.

Energy characteristics and the information retrieval rate of a 1 GB electroluminescent optical card as a function of the CCD accumulation time are set forth in the table below. The pit square is 1 $\mu m^2$, the fluorescence wavelength is 555 nm, the pit brightness is 3000 cd/$M^2$, and the objective numerical aperture is 0.45.

| Accumulation time of CCD camera, ms | Total number of photons incident on each pixel | Data rate, MB/s |
| --- | --- | --- |
| 1000 | $10^7$ | 0.25 |
| 100 | $10^6$ | 2.5 |

-continued

| Accumulation time of CCD camera, ms | Total number of photons incident on each pixel | Data rate, MB/s |
| --- | --- | --- |
| 10 | $10^5$ | 25 |
| 1 | $10^4$ | 250 |

Figure 7:
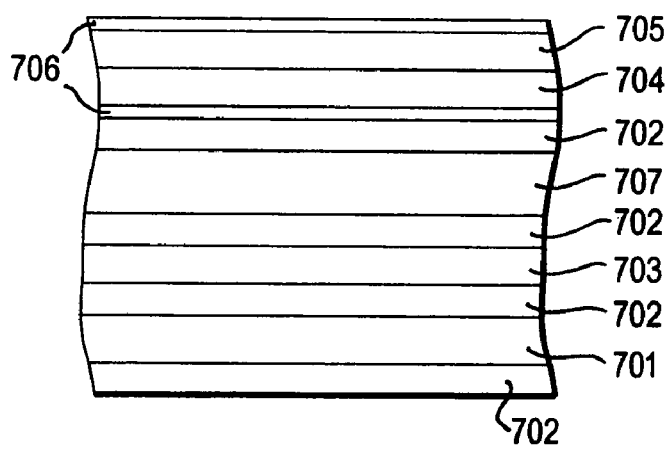
FIG. 7 shows a cross-sectional view of the layers of an optical card according to a fifth embodiment of the present invention.

A fifth embodiment will now be set forth. As shown in FIG. 7, the fifth embodiment is directed to a card 700 having information layers 701, each with its electrode layers 702, separated by insulating layers 703. The construction and operation of such layers can be as in any of the preceding embodiments. In addition, a photoconductive layer 704 and an electroluminescnet layer 705 are provided above all of the information layers 702.

A single information layer 702 has a relatively small thickness, typically less than 0.1 micron, and the applied voltage can be reduced from that used in the previous embodiments.

The photoconductive layer 704 and the electroluminescent layer 705 together make up an imaging layer with two optically transparent electrodes 706. The layers 704 and 705, and thus the imaging layer, are divided into pixels, each of size comparable with the size of a pixel in the information layer.

A voltage is applied to the imaging layer through the electrodes 706. The voltage chosen is not by itself sufficient to cause electroluminescence from the electroluminescent layer 705. When a page from an information layer 702 is activated, its weak light induces a photocurrent in the photoconductive layer 704, thus leading to a redistribution of the voltage between the photoconductive and electroluminescent layers 704 and 705. Most of the voltage is now applied to the electroluminescent layer 705, thereby causing electroluminescence in the electroluminescent layer 705. The electroluminescence is induced only in the pixels of the imaging layer situated above the pits of the information layer from the radiating page. Since the distance between information layers and the electroluminescent layer 705 is small compared to the wavelength of electroluminescent light, the cross-talk between different pits is small. As a result, the data stored in the information layer are faithfully transferred to the imaging layer. The suggested method of readout of the weak information signal by using the imaging layer serves as an effective "optical transistor."

The cards and other media according to the embodiments disclosed above have the following advantages:

Absence of interlayer and interpage crosstalk (as electroluminescence is excited only in a desired page);

Ultrahigh data density (1 bit/$mcm^3$ or 10(Gbites/$cm^3$);

The possibility of a color electroluminescent card, providing higher information capacity; and High information bit rate (more than 1 Gbit/sec).

While various preferred embodiments have been set forth in detail above, those skilled in the art who have reviewed the present disclosure will readily appreciate that other embodiments can be realized within the scope of the invention. For example, any suitable materials can be used to form the various parts of the card, and any suitable arrangement of electrodes can be used. Therefore, the present invention should be construed as limited only by the appended claims.

We claim:

1. A write once, read many information storage medium comprising:
   a plurality of information layers, each of the plurality of layers having at least one groove; and
   in each groove of each of the plurality of information layers, an active layer comprising:
   an electroluminescent material;
   a fluorescent quencher for the electroluminescent material; and
   a free radical generating compound that, when thermally degraded, generates free radicals that react with the quencher to bleach the quencher.

2. The write once, read many information storage medium of claim 1, wherein each groove is spiral.

* * * * *